(12) United States Patent
Moon et al.

(10) Patent No.: US 11,355,563 B2
(45) Date of Patent: Jun. 7, 2022

(54) DISPLAY DEVICE WITH HIGH REFRACTIVE INDEX AND LOW REFRACTIVE INDEX LAYERS

(71) Applicant: SAMSUNG DISPLAY CO., LTD., Yongin-si (KR)

(72) Inventors: Jeongwoo Moon, Yongin-si (KR); Byounghee Park, Yongin-si (KR); Jinkoo Chung, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 6 days.

(21) Appl. No.: 16/158,520

(22) Filed: Oct. 12, 2018

(65) Prior Publication Data

US 2019/0115404 A1   Apr. 18, 2019

(30) Foreign Application Priority Data

Oct. 12, 2017   (KR) .......................... 10-2017-0132227

(51) Int. Cl.
| | |
|---|---|
| *H01L 27/32* | (2006.01) |
| *H01L 27/12* | (2006.01) |
| *H01L 51/52* | (2006.01) |
| *H01L 51/50* | (2006.01) |

(52) U.S. Cl.
CPC ........ *H01L 27/3246* (2013.01); *H01L 27/124* (2013.01); *H01L 27/3262* (2013.01); *H01L 51/5012* (2013.01); *H01L 51/5206* (2013.01); *H01L 51/5221* (2013.01); *H01L 51/5271* (2013.01); *H01L 51/5275* (2013.01); *H01L 51/5253* (2013.01); *H01L 2251/5315* (2013.01)

(58) Field of Classification Search
CPC ............. H01L 27/3246; H01L 51/5271; H01L 51/5275; H01L 27/124; H01L 27/3262; H01L 51/5012; H01L 51/5206; H01L 51/5221; H01L 51/5253
USPC .............................................. 257/40, 88, 98
See application file for complete search history.

(56) References Cited

U.S. PATENT DOCUMENTS

| | | | |
|---|---|---|---|
| 7,030,556 | B2 | 4/2006 | Adachi et al. |
| 7,492,092 | B2 | 2/2009 | Yamauchi |
| 9,070,901 | B2 | 6/2015 | Boerner |
| 9,537,013 | B2 | 1/2017 | Nishinohara et al. |
| 9,806,296 | B2 | 10/2017 | Kang et al. |
| 10,566,576 | B2 | 2/2020 | Kim et al. |

(Continued)

FOREIGN PATENT DOCUMENTS

| | | |
|---|---|---|
| KR | 10 2004-0051483 A | 6/2004 |
| KR | 1020040054543 A | 6/2004 |

(Continued)

*Primary Examiner* — Robert T Huber
(74) *Attorney, Agent, or Firm* — Lewis Roca Rothgerber Christie LLP

(57) ABSTRACT

A display device includes a first substrate, an organic light emitting element on the first substrate and including a first electrode, an organic light emitting layer, and a second electrode, a pixel defining layer surrounding the first electrode, a thin film encapsulation layer, and a capping layer on the thin film encapsulation layer. The capping layer may include two reflective interfaces adjacent the light emission or pixel area spaced apart from one another in a plane view. The reflective interfaces may include a boundary between high and low refractive index materials and/or a reflective layer.

17 Claims, 11 Drawing Sheets

(56) References Cited

U.S. PATENT DOCUMENTS

| | | | | |
|---|---|---|---|---|
| 2014/0027735 A1* | 1/2014 | Kim | ........................ | H01L 51/56 |
| | | | | 257/40 |
| 2015/0280172 A1* | 10/2015 | Nishinohara | ..... | H01L 29/78606 |
| | | | | 257/40 |
| 2016/0118628 A1* | 4/2016 | Kang | .................. | H01L 51/5275 |
| | | | | 257/40 |
| 2016/0149163 A1 | 5/2016 | Chen et al. | | |

FOREIGN PATENT DOCUMENTS

| | | |
|---|---|---|
| KR | 10 0944311 B1 | 2/2010 |
| KR | 10 2011-0004419 A | 1/2011 |
| KR | 1020140014682 A | 2/2014 |
| KR | 10 2015-0074826 A | 7/2015 |
| KR | 10 2015-0100995 A | 9/2015 |
| KR | 1020150113835 A | 10/2015 |
| KR | 10 2016-0029087 A | 3/2016 |
| KR | 1020160049157 A | 5/2016 |
| KR | 10 1669088 B1 | 10/2016 |
| KR | 1020170074312 A | 6/2017 |

* cited by examiner

\* 300:311,321,321a,322,322a,323,323a,331,332

DISPLAY DEVICE WITH HIGH REFRACTIVE INDEX AND LOW REFRACTIVE INDEX LAYERS

CROSS-REFERENCE TO RELATED APPLICATION

Korean Patent Application No. 10-2017-0132227, filed on Oct. 12, 2017, in the Korean Intellectual Property Office, and entitled: "Display Device," is incorporated by reference herein in its entirety.

BACKGROUND

1. Field

Embodiments relate to a display device for improving light emission efficiency.

2. Description of the Related Art

Organic light emitting diode ("OLED") display devices are self-light emitting display devices that display images using an OLED. The OLED display devices are currently garnering attention by virtue of their characteristics such as low power consumption, high luminance, high reaction speed, and the like.

Light emitted by the OLED is emitted not only toward the front side but also toward the lateral side of the display device. Accordingly, light emission efficiency of the display device is lowered, and power consumption of the display device may increase. Thus, there is a need for a method of improving the light emission efficiency and for reducing the power consumption in the OLED display devices.

It is to be understood that this background of the technology section is intended to provide useful background for understanding the technology and as such disclosed herein, the technology background section may include ideas, concepts or recognitions that were not part of what was known or appreciated by those skilled in the pertinent art prior to a corresponding effective filing date of subject matter disclosed herein.

SUMMARY

According to an exemplary embodiment, a display device includes: a first substrate; an organic light emitting element disposed on the first substrate and including a first electrode, an organic light emitting layer, and a second electrode; a pixel defining layer surrounding the first electrode on the first substrate; a thin film encapsulation layer on the organic light emitting element and the pixel defining layer; a high refractive index portion overlapping, on a plane, at least a portion of the first electrode on the thin film encapsulation layer; a first low refractive index portion overlapping, on a plane, the pixel defining layer on the thin film encapsulation layer and including a first inclined portion forming a first angle with the thin film encapsulation layer; a second low refractive index portion disposed, on a plane, between the first low refractive index portion and the high refractive index portion on the thin film encapsulation layer and including a second inclined portion forming a second angle with the thin film encapsulation layer; and a first reflection layer disposed, on a plane, between the first low refractive index portion and the second low refractive index portion on the thin film encapsulation layer.

The first angle may be about 45 degrees or more.

The second angle may be about 60 degrees or more.

The high refractive index portion may have a refractive index of about 1.6 or more and the first and second low refractive index portions may have refractive indices less than about 1.6.

The first low refractive index portion may have a refractive index substantially equal to a refractive index of the second low refractive index portion.

The display device may further include a circular polarization plate on the high refractive index portion and the first low refractive index portion and the second low refractive index portion.

The reflection layer may include at least one of molybdenum (Mo), an alloy (MoTi) of molybdenum and titanium, aluminum (Al), silver (Ag), APC (Ag; Pb; Cu), and platinum (Pt).

The first reflection layer may have a thickness of about 300 Å or more.

The first low refractive index portion may have a thickness less than a thickness of the second low refractive index portion.

The second low refractive index portion may be disposed on the first low refractive index portion and the first reflection layer.

According to an exemplary embodiment, a display device includes: a first substrate; an organic light emitting element disposed on the first substrate and including a first electrode, an organic light emitting layer, and a second electrode; a pixel defining layer surrounding the first electrode on the first substrate; a thin film encapsulation layer on the organic light emitting element and the pixel defining layer; a first low refractive index portion overlapping, on a plane, the pixel defining layer on the thin film encapsulation layer and including a first inclined portion forming a first angle with the thin film encapsulation layer; a second low refractive index portion including a second inclined portion forming a second angle with the thin film encapsulation layer; a third low refractive index portion spaced apart from the first low refractive index portion and overlapping, on a plane, at least a portion of the first electrode; a first reflection layer disposed between the first low refractive index portion and the second low refractive index portion on the thin film encapsulation layer; and a second reflection layer disposed between the second low refractive index portion and the third low refractive index portion on the thin film encapsulation layer. The second low refractive index portion is disposed between the first low refractive index portion and the third low refractive index portion on a plane.

The first low refractive index portion may have a refractive index substantially equal to a refractive index of the second low refractive index portion, and the second low refractive index portion may have a refractive index substantially equal to a refractive index of the third low refractive index portion.

The first reflection layer may include a material substantially equal to a material included in the second reflection layer.

The first angle and the second angle may be about 45 degrees or more.

According to an exemplary embodiment, a display device includes: a first substrate; an organic light emitting element disposed on the first substrate and including a first electrode, an organic light emitting layer, and a second electrode; a pixel defining layer surrounding the first electrode on the first substrate; a thin film encapsulation layer on the organic light emitting element and the pixel defining layer; a high refractive index portion overlapping at least a portion of the first electrode on the thin film encapsulation layer; a first low refractive index portion overlapping, on a plane, the pixel defining layer on the thin film encapsulation layer and including a first inclined portion forming a first angle with the thin film encapsulation layer; a second low refractive index portion including a second inclined portion forming a second angle with the thin film encapsulation layer; a third low refractive index portion directly contacting the high refractive index portion, spaced apart from the first low refractive index portion, and including a third inclined portion forming a third angle with the thin film encapsulation layer; a first reflection layer disposed between the first low refractive index portion and the second low refractive index portion; and a second reflection layer disposed between the second low refractive index portion and the third low refractive index portion. The second low refractive index portion is disposed between the first low refractive index portion and the third low refractive index portion on a plane.

The first low refractive index portion may have a refractive index substantially equal to a refractive index of the second low refractive index portion, and the second low refractive index portion may have a refractive index substantially equal to a refractive index of the third low refractive index portion.

The first angle and the second angle may be about 45 degrees or more.

The third angle may be about 60 degrees or more.

The high refractive index portion may have a refractive index of about 1.6 or more and the first, second and third low refractive index portions may have refractive indices less than about 1.6.

The first low refractive index portion may have a refractive index substantially equal to a refractive index of the second low refractive index portion, and the first low refractive index portion may have a refractive index substantially equal to a refractive index of the third low refractive index portion.

The foregoing is illustrative only and is not intended to be in any way limiting. In addition to the illustrative aspects, exemplary embodiments and features described above, further aspects, exemplary embodiments and features will become apparent by reference to the drawings and the following detailed description.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
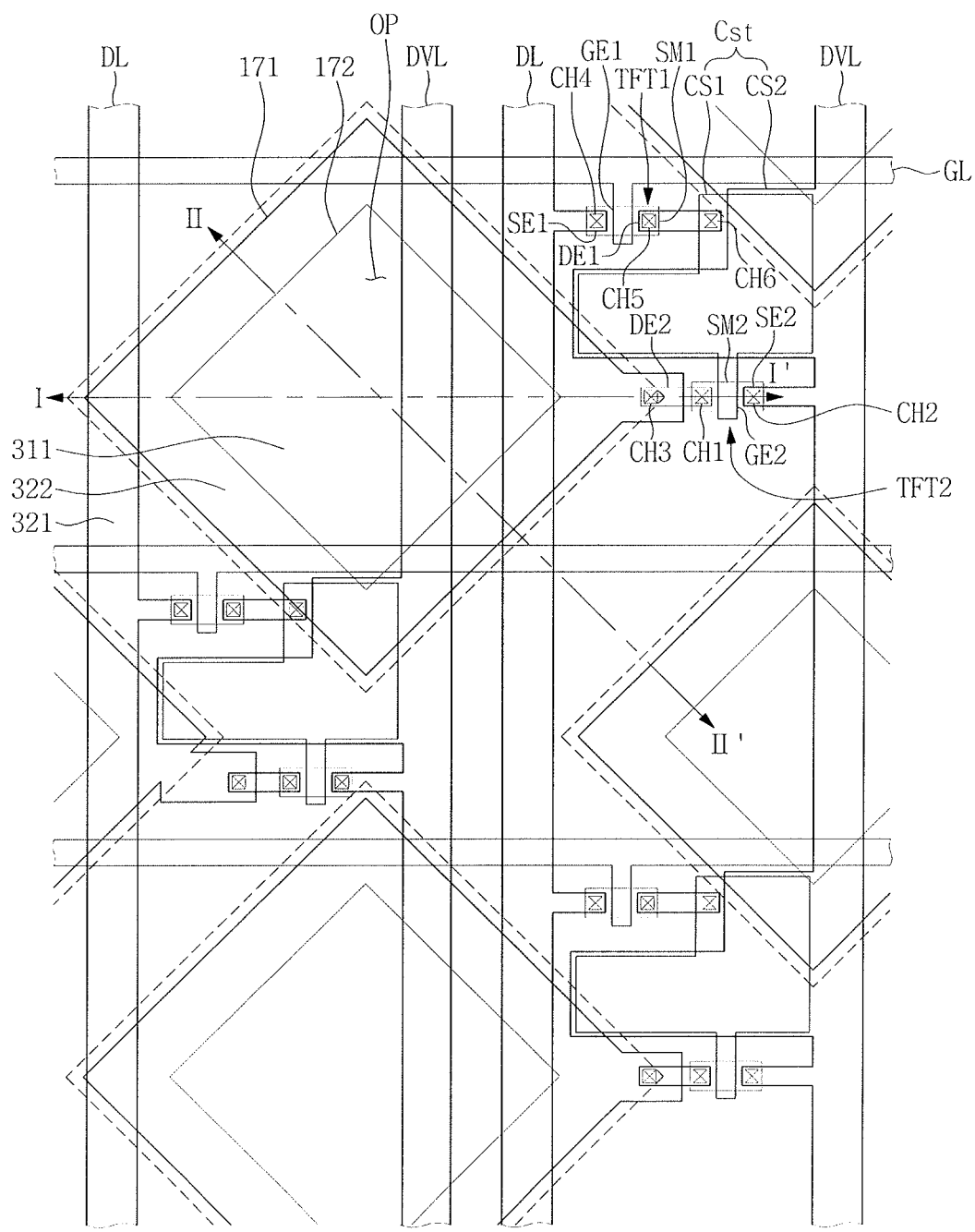
FIG. 1 illustrates a plan view of a pixel of a display device according to an exemplary embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawings, thicknesses of a plurality of layers and areas are illustrated in an enlarged manner for clarity and ease of description thereof. When a layer, area, or plate is referred to as being "on" another layer, area, or plate, it may be directly on the other layer, area, or plate, or intervening layers, areas, or plates may be present therebetween. Conversely, when a layer, area, or plate is referred to as being "directly on" another layer, area, or plate, intervening layers, areas, or plates may be absent therebetween. Further when a layer, area, or plate is referred to as being "below" another layer, area, or plate, it may be directly below the other layer, area, or plate, or intervening layers, areas, or plates may be present therebetween. Conversely, when a layer, area, or plate is referred to as being "directly below" another layer, area, or plate, intervening layers, areas, or plates may be absent therebetween.

The spatially relative terms "below", "beneath", "lower", "above", "upper" and the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in the other direction and thus the spatially relative terms may be interpreted differently depending on the orientations.

Throughout the specification, when an element is referred to as being "connected" to another element, the element is "directly connected" to the other element, or "electrically connected" to the other element with one or more intervening elements interposed therebetween. It will be further understood that the terms "comprises," "including,"

"includes" and/or "including," when used in this specification, specify the presence of stated features, integers, steps, operations, elements and/or components, but do not preclude the presence or addition of one or more other features, integers, steps, operations, elements, components and/or groups thereof.

It will be understood that, although the terms "first," "second," "third," and the like may be used herein to describe various elements, these elements should not be limited by these terms. These terms are only used to distinguish one element from another element. Thus, "a first element" discussed below could be termed "a second element" or "a third element," and "a second element" and "a third element" may be termed likewise without departing from the teachings herein.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined, all terms used herein (including technical and scientific terms) have the same meaning as commonly understood by those skilled in the art to which this disclosure pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the present specification.

Some of the parts which are not associated with the description may not be provided in order to specifically describe embodiments and like reference numerals refer to like elements throughout the specification.

Figure 2A:
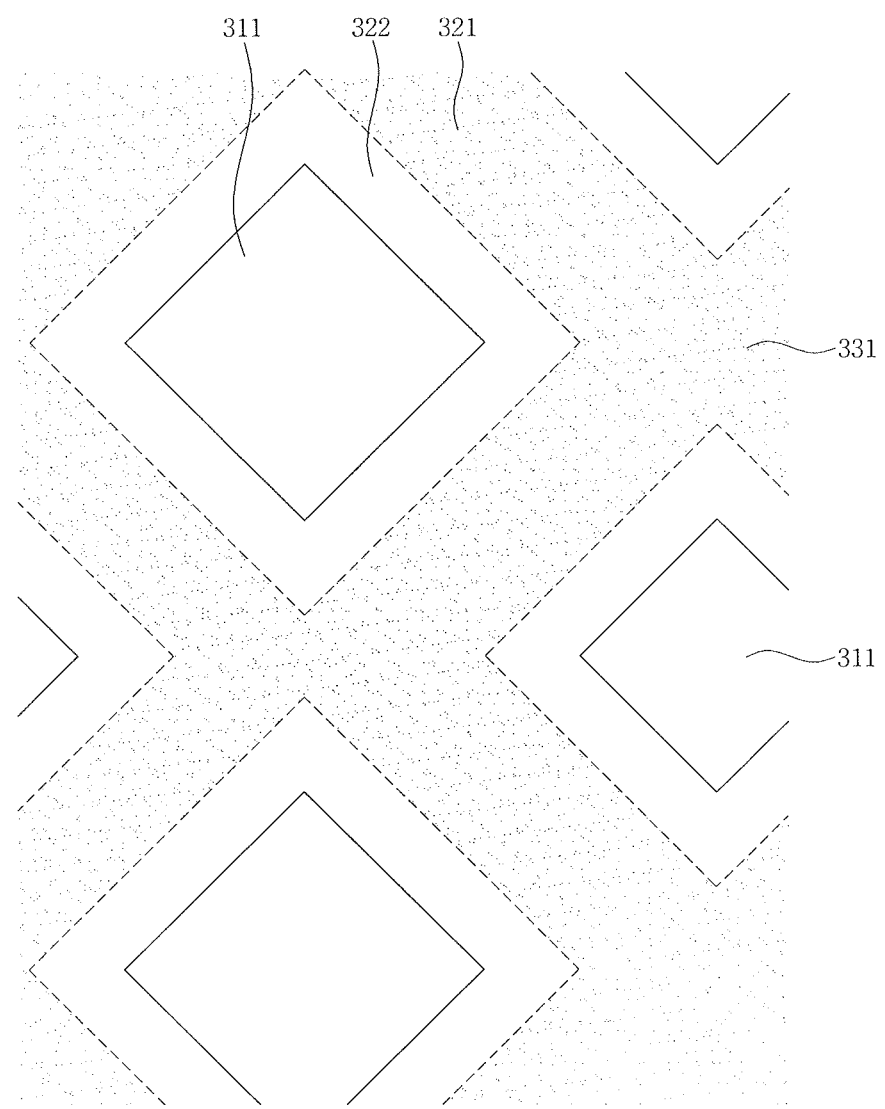
FIG. 2A illustrates a plan view of a high refractive index portion, a first low refractive index portion, a first reflection layer, and a second low refractive index portion according to an exemplary embodiment.
Figure 2B:
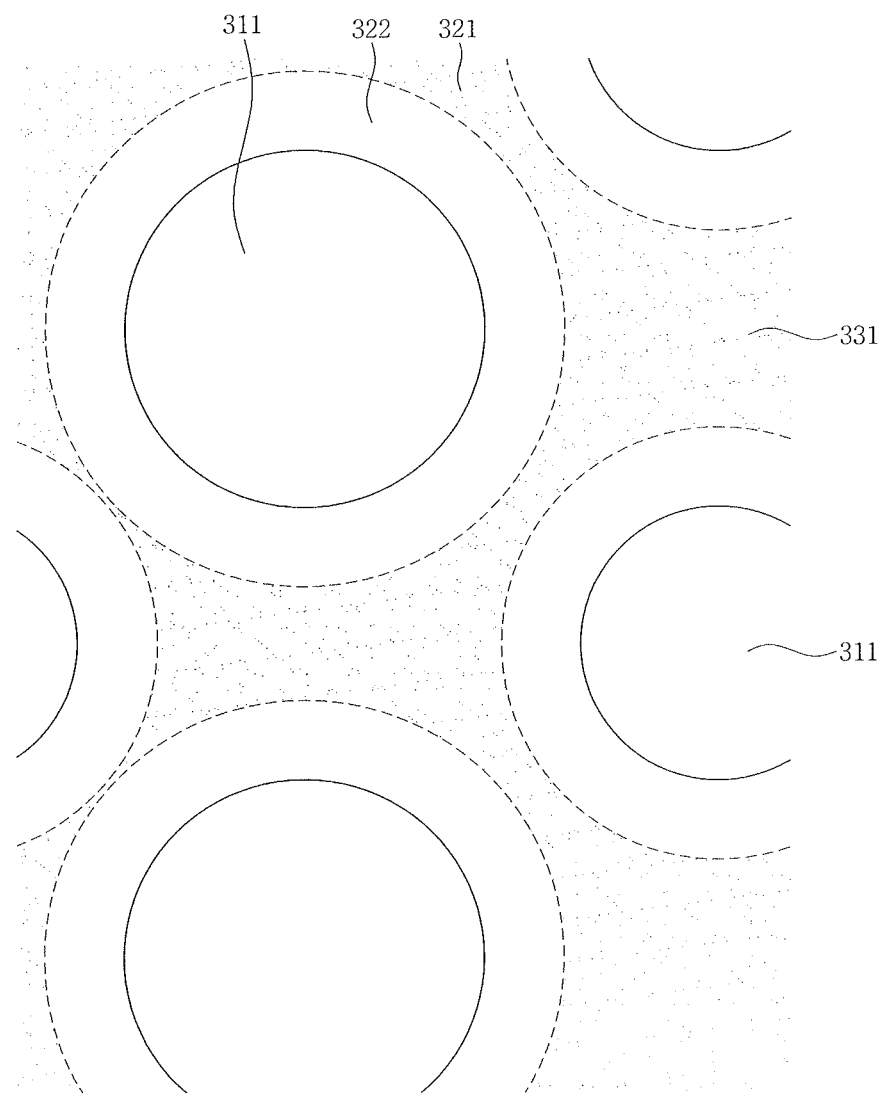
FIG. 2B illustrates another plan view of a high refractive index portion, a first low refractive index portion, a first reflection layer and a second low refractive index portion.
Figure 3:
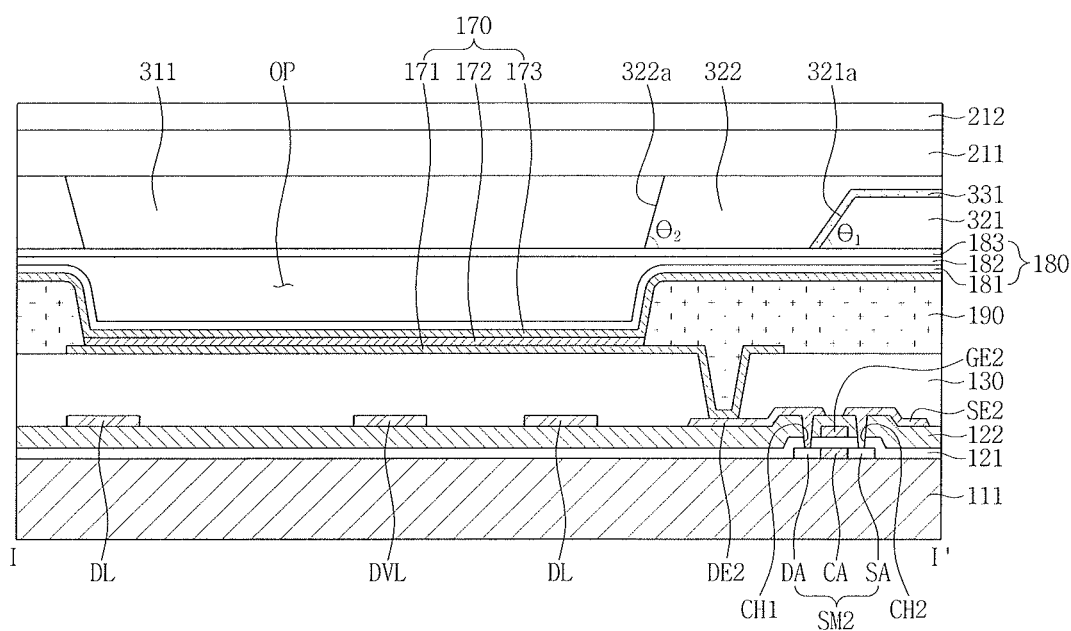
FIG. 3 illustrates a cross-sectional view taken along the line I-I' of FIG. 1.
Figure 4:
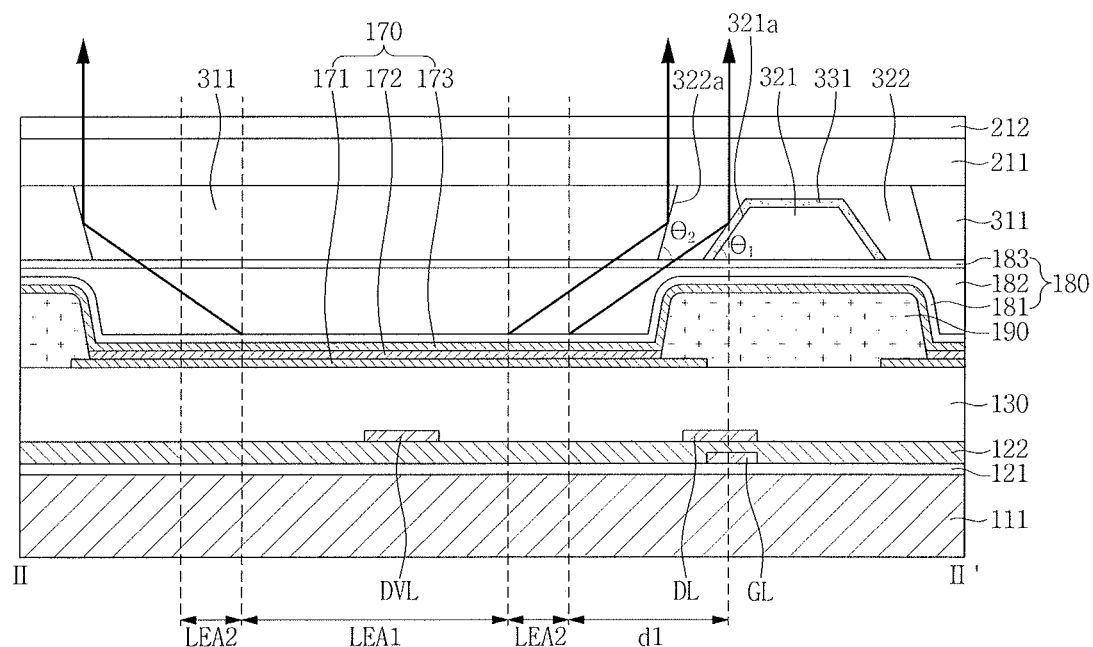
FIG. 4 illustrates a cross-sectional view taken along the line II-II' of FIG. 1.

FIG. 1 illustrates a plan view a pixel of a display device according to an exemplary embodiment. FIG. 2A illustrates a plan view of a high refractive index portion, a first low refractive index portion, a first reflection layer, and a second low refractive index portion according to an exemplary embodiment. FIG. 2B illustrates another plan view illustrating a high refractive index portion, a first low refractive index portion, a first reflection layer and a second low refractive index portion. FIG. 3 illustrates a cross-sectional view taken along the line I-I' of FIG. 1. FIG. 4 illustrates a cross-sectional view taken along the line II-II' of FIG. 1.

A display device according to an exemplary embodiment includes a plurality of pixels. A pixel refers to a smallest unit for displaying images. Referring to FIGS. 1, 2, 3, and 4, the pixel includes a switching thin film transistor TFT1, a driving thin film transistor TFT2, an organic light emitting diode ("OLED") 170, and a capacitor Cst.

The pixel may generate light of a predetermined color, e.g., red, green, or blue. However, the color of the light generated is not limited thereto, e.g., cyan, magenta, yellow, or the like, may be generated in the pixel.

The pixel is connected to a gate line GL, a data line DL, and a driving voltage line DVL. The gate line GL extends in a first direction. The data line DL extends in a second direction, which intersects the first direction, such that the data line DL crosses the gate line GL. Referring to FIG. 1, the driving voltage line DVL extends in a direction substantially the same as a direction in which the data line DL extends. The gate line GL transmits a scan signal, the data line DL transmits a data signal, and the driving voltage line DVL transmits a driving voltage.

The thin film transistors TFT1 and TFT2 may include the driving thin film transistor TFT2 for controlling the OLED 170 and the switching thin film transistor TFT1 for switching the driving thin film transistor TFT2. Although each pixel according to the present exemplary embodiment includes two thin film transistors TFT1 and TFT2, exemplary embodiments are not limited thereto. For example, each pixel may include a different number of thin film transistors and/or capacitors in another exemplary embodiment, e.g., one thin film transistor and one capacitor, three or more thin film transistors and two or more capacitors, and so forth.

The switching thin film transistor TFT1 includes a first gate electrode GE1, a first source electrode SE1, a first drain electrode DE1, and a first semiconductor layer SM1. The first gate electrode GE1 is connected to the gate line GL and the first source electrode SE1 is connected to the data line DL.

The first drain electrode DE1 is connected to a first capacitor plate CS1 through a fifth contact hole CH5 and a sixth contact hole CH6. The switching thin film transistor TFT1 transmits a data signal, applied to the data line DL, to the driving thin film transistor TFT2 according to a scan signal applied to the gate line GL.

The driving thin film transistor TFT2 includes a second gate electrode GE2, a second source electrode SE2, a second drain electrode DE2, and a second semiconductor layer SM2. The second gate electrode GE2 is connected to the first capacitor plate CS1. The second source electrode SE2 is connected to the driving voltage line DVL. The second drain electrode DE2 is connected to a first electrode 171 through a third contact hole CH3.

The first electrode 171 is connected to the second drain electrode DE2 of the driving thin film transistor TFT2. An organic light emitting layer 172 is on the first electrode 171 and a second electrode 173 (see FIG. 3) is on the organic light emitting layer 172. A common voltage is applied to the second electrode 173, and the organic light emitting layer 172 generates light according to an output signal of the driving thin film transistor TFT2.

The capacitor Cst is connected between the second gate electrode GE2 and the second source electrode SE2 of the driving thin film transistor TFT2. The capacitor Cst charges and maintains a signal input to the second gate electrode GE2 of the driving thin film transistor TFT2. The capacitor Cst includes the first capacitor plate CS1 connected to the first drain electrode DE1 through the sixth contact hole CH6 and a second capacitor plate CS2 connected to the driving voltage line DVL.

Referring to FIGS. 1, 2, 3, and 4, the thin film transistors TFT1 and TFT2 and the OLED 170 are on a first substrate 111. The material of the first substrate 111 is not particularly limited. For example, the first substrate 111 may include an insulating material, e.g., glass, plastic, quartz, or the like. The material for the first substrate 111 may be selected, e.g., from materials which are excellent in mechanical strength, thermal stability, transparency, surface smoothness, ease of handling, water resistance, or the like.

A buffer layer may be on the first substrate 111. The buffer layer may substantially prevent diffusion of impurities into the switching thin film transistor TFT1 and the driving thin film transistor TFT2.

The first semiconductor layer SM1 and the second semiconductor layer SM2 are on the first substrate 111. The first semiconductor layer SM1 and the second semiconductor layer SM2 may include a semiconductor material that serves as active layers of the switching thin film transistor TFT1 and the driving thin film transistor TFT2, respectively. Each of the first semiconductor layer SM1 and the second semiconductor layer SM2 may include a source area SA, a drain area DA, and a channel area CA between the source area SA and the drain area DA.

The first semiconductor layer SM1 and the second semiconductor layer SM2 may include, e.g., amorphous silicon or polycrystalline silicon, or may include, e.g., an oxide semiconductor. For example, each of the first semiconductor layer SM1 and the second semiconductor layer SM2 may include an inorganic semiconductor material or an organic semiconductor material. The source area SA and the drain area DA may be doped with an n-type impurity or a p-type impurity.

A gate insulating layer 121 may be on the first semiconductor layer SM1 and the second semiconductor layer SM2. The gate insulating layer 121 protects the first semiconductor layer SM1 and the second semiconductor layer SM2. The gate insulating layer 121 may include an organic insulating material or an inorganic insulating material.

The first gate electrode GE1 and the second gate electrode GE2 are on the gate insulating layer 121. The first gate electrode GE1 and the second gate electrode GE2 may overlap, e.g., along a third direction intersecting the first and second directions and orthogonal to an upper surface of the substrate 111, the channel areas CA of the first semiconductor layer SM1 and the second semiconductor layer SM2, respectively. In addition, the first capacitor plate CS1 may be on the gate insulating layer 121. The second gate electrode GE2 may be unitarily with the first capacitor plate CS1.

An insulating interlayer 122 is on the first gate electrode GEE the second gate electrode GE2, and the first capacitor plate CS1. The insulating interlayer 122 may include an organic insulating material or an inorganic insulating material.

The first source electrode SE1, the first drain electrode DEL the second source electrode SE2, and the second drain electrode DE2 may be on the insulating interlayer 122. The second drain electrode DE2 contacts the drain area DA of the second semiconductor layer SM2 through a first contact hole CH1 in the gate insulating layer 121 and the insulating interlayer 122. The second source electrode SE2 contacts the source area SA of the second semiconductor layer SM2 through a second contact hole CH2 in the gate insulating layer 121 and the insulating interlayer 122. The first source electrode SE1 contacts the first semiconductor layer SM1 through a fourth contact hole CH4 in the gate insulating layer 121 and the insulating interlayer 122. The first drain electrode DE1 contacts the first semiconductor layer SM1 through the fifth contact hole CH5 in the gate insulating layer 121 and the insulating interlayer 122.

The data line DL, the driving voltage line DVL, and the second capacitor plate CS2 may be on the insulating interlayer 122. The second capacitor plate CS2 may be formed unitarily with the driving voltage line DVL.

A protection layer 130 may be on the first source electrode SE1, the first drain electrode DE1, the second source electrode SE2, and the second drain electrode DE2. The protection layer 130 serves to protect the switching thin film transistor TFT1 and the driving thin film transistor TFT2, and may also serves to planarize upper surfaces thereof.

The first electrode 171 may be on the protection layer 130. The first electrode 171 may be, e.g., an anode electrode. According to an exemplary embodiment, the first electrode 171 is a pixel electrode. The first electrode 171 may be connected to the second drain electrode DE2 of the driving thin film transistor TFT2 through the third contact hole CH3 in the protection layer 130.

A pixel defining layer 190 may be on protection layer 130. The pixel defining layer 190 may include a polymer organic material. The pixel defining layer 190 may include at least one of, for example, a polyimide (PI) resin, a polyacrylic resin, a polyethylene terephthalate (PET) resin, and a polyethylene-naphthalate (PEN) resin. According to an exemplary embodiment, the pixel defining layer 190 may include a polyimide (PI) resin.

The pixel defining layer 190 defines an opening OP, and the first electrode 171 is exposed through the opening OP. In addition, a light emission area of the OLED 170, e.g., a pixel area, is defined by the opening OP.

Referring to FIGS. 1 and 4, the pixel defining layer 190 exposes an upper surface of the first electrode 171 and protrudes from the first electrode 171 in the third direction along a periphery of each pixel. The first electrode 171 overlaps at least a portion of the pixel defining layer 190 and does not overlap the pixel defining layer 190 at the opening OP. The opening OP may be defined as a portion of an area above the first electrode 171 that does not overlap the pixel defining layer 190.

The first electrode 171 is electrically conductive, and may be a transmissive electrode, a transflective electrode, or a reflective electrode. When the first electrode 171 is a transmissive electrode, the first electrode 171 includes a transparent conductive oxide. For example, the transparent conductive oxide may include at least one of indium tin oxide (ITO), indium zinc oxide (IZO), zinc oxide (ZnO), and indium tin zinc oxide (ITZO). When the first electrode 171 is a transflective electrode or a reflective electrode, the first electrode 171 may include at least one of Ag, Mg, Al, Pt, Pd, Au, Ni, Nd, Ir, Cr, and Cu.

The organic light emitting layer 172 may be on the first electrode 171, e.g., in the opening OP. In particular, the organic light emitting layer 172 may be on the first electrode 171 in the opening OP. The organic light emitting layer 172 may be on a sidewall of the opening OP defined by the pixel defining layer 190 such that organic light emitting layer 172 contacts the pixel defining layer 190.

The organic light emitting layer 172 includes a light emitting material. In addition, the organic light emitting layer 172 may include a host and a light emitting dopant. The organic light emitting layer 172 may be manufactured using a known method, using a known material. For example, the organic light emitting layer 172 may be formed through various methods, e.g., vacuum deposition, spin coating, casting, a Langmuir-Blodgett (LB) method, inkjet printing, laser printing, a laser induced thermal imaging (LITI), and the like.

At least one of a hole injection layer (HIL) and a hole transport layer (HTL) may be between the first electrode 171 and the organic light emitting layer 172.

The second electrode 173 may be on the organic light emitting layer 172, e.g., in the opening OP. The second electrode 173 may also extend along the third direction in contact with a sidewall of the pixel defining layer 190 and may extend along an upper surface of the pixel defining layer 190. The second electrode 173 may be a common electrode and may be a cathode. The second electrode 173 may be a transmissive electrode, a transflective electrode, or a reflective electrode.

When the second electrode 173 is a transmissive electrode, the second electrode 173 may include at least one of Li, Ca, LiF/Ca, LiF/Al, Al, Mg, BaF, Ba, Ag, and Cu. For example, the second electrode 173 may include a mixture of Ag and Mg.

When the second electrode 173 is a transflective electrode or a reflective electrode, the second electrode 173 may include at least one of Ag, Mg, Al, Pt, Pd, Au, Ni, Nd, Ir, Cr, Li, Ca, LiF/Ca, LiF/Al, Mo, Ti and Cu. In addition, the second electrode 173 may further include a transparent conductive layer which includes, for example, indium tin oxide (ITO), indium zinc oxide (IZO), zinc oxide (ZnO), and indium-zinc-tin oxide (IZTO), in addition to the transflective electrode or the reflective electrode.

At least one of an electron transport layer (ETL) and an electron injection layer (EIL) may be between the organic light emitting layer 172 and the second electrode 173.

When the OLED 170 is a top emission type, the first electrode 171 may be a reflective electrode and the second electrode 173 may be a transmissive or transflective electrode. When the OLED 170 is a bottom emission type, the first electrode 171 may be a transmissive or transflective electrode, and the second electrode 173 may be a reflective electrode.

According to an exemplary embodiment, the OLED 170 may be a top emission type, the first electrode 171 may be a reflective electrode, and the second electrode 173 may be a transflective electrode.

A thin film encapsulation layer 180 may be on the second electrode 173 to protect the OLED 170. The thin film encapsulation layer 180 may substantially prevent outside contaminants, e.g., moisture or oxygen, from penetrating into the OLED 170. Specifically, the thin film encapsulation layer 180 may include at least one inorganic layer 181 and 183, and at least one organic layer 182 alternately arranged with the at least one inorganic layer 181 and 183

Referring to FIGS. 3 and 4, the thin film encapsulation layer 180 may include two inorganic layers 181 and 183, and one organic layer 182. Specifically, the at least one inorganic layer may include a first inorganic layer 181 and a second inorganic layer 183, and the at least one organic layer may include a first organic layer 182 between the first inorganic layer 181 and the second inorganic layer 183. However, exemplary embodiments are limited to the structure illustrated in FIGS. 3 and 4.

A capping layer 300 may be on the second electrode 173. The capping layer 300 may protect the OLED 170 and may help light emitted from the organic light emitting layer 172 to be efficiently emitted.

The capping layer 300 may include at least one of inorganic and organic materials having light transmitting characteristics. The capping layer may have a thickness in a range from about 30 nm to about 300 nm, and may have a thickness of about 300 nm or more. As the thickness of the capping layer increases, it is advantageous to protect the OLED 170. However, if the capping layer is too thick, it is disadvantageous for slimming down the display device. The capping layer may be formed by methods known in the art, e.g., deposition.

According to an exemplary embodiment, the capping layer 300 may include a high refractive index portion 311, a first low refractive index portion 321, a first reflection layer 331, and a second low refractive index portion 322 on the thin film encapsulation layer 180. In particular, these portions together form a light control layer may that may have a same thickness along the third direction, but have varying characteristics along in portions arranged in the first and second directions. As discussed in detail below, the capping layer 300 may include two reflective interfaces adjacent the pixel area.

The high refractive index portion 311 overlaps at least a portion of the first electrode 171 on a plane. Specifically, the high refractive index portion 311 overlaps the opening OP, e.g., a substantial entirety of the opening OP, of the pixel defining layer 190 along the third direction. The high refractive index portion 311 may have an area less than an area of the first electrode 171 on a plane, and may have an area substantially equal to an area of the opening OP on a plane, e.g., along the first and second directions. However, exemplary embodiments are not limited thereto, and the high refractive index portion 311 may have an area larger than an area of the opening OP on a plane.

The high refractive index portion 311 may have a quadrangular shape on a plane e.g., along the first and second directions as illustrated in FIG. 2A. However, exemplary embodiments are not limited thereto, and the high refractive index portion 311 may have a circular shape on a plane as illustrated in FIG. 2B, or may have various shapes.

Upper surfaces of the high refractive index portion 311, the first low refractive index portion 321, the first reflection layer 331, and the second low refractive index portion 322 may be flat. However, exemplary embodiments are not limited thereto.

The high refractive index portion 311 has a refractive index higher than refractive indices of the first low refractive index portion 321 and the second low refractive index portion 322 to be described below. Specifically, the high refractive index portion 311 may have a refractive index of about 1.6 or more, and the first low refractive index portion 321 and the second low refractive index portion 322 may have a refractive index less than about 1.6. For example, the high refractive index portion 311 may have a refractive index of about 1.65, and the first low refractive index portion 321 and the second low refractive index portion 322 may have a refractive index of about 1.5.

The first low refractive index portion 321, the first reflection layer 331, and the second low refractive index portion 322 overlap the pixel defining layer 190 on a plane, e.g., along the third direction.

The first low refractive index portion 321 overlaps the pixel defining layer 190 on a plane and is spaced apart from the high refractive index portion 311 between the plurality of high refractive index portions 311. Accordingly, the first low refractive index portion 321 may have an area less than an area of the pixel defining layer 190 on a plane.

The first low refractive index portion 321 may have a thickness less than a thickness of the high refractive index portion 311, e.g., along the third direction. However, exemplary embodiments are not limited thereto, and the first low refractive index portion 321 may have a thickness substantially equal to a thickness of the high refractive index portion 311.

The first low refractive index portion 321 may include a first inclined portion 321a that forms a first angle $\theta_1$ with an upper surface of the thin film encapsulation layer 180. The first inclined portion 321a will be described below in detail with reference to FIGS. 5A, 5B and 5C.

The first reflection layer 331 overlaps the pixel defining layer 190 and is spaced apart from the high refractive index portions 311 between the plurality of high refractive index portions 311, as described in FIGS. 2A and 2B. Accordingly, the first reflection layer 331 may have an area less than an area of the pixel defining layer 190 on a plane.

The first reflection layer 331 may cover the first low refractive index portion 321. Accordingly, the first reflection layer 331 and the thin film encapsulation layer 180 may form an angle substantially equal to the first angle $\theta_1$ of the first inclined portion 321*a*. For example, an upper surface of the first reflection layer 331 and an upper surface of the thin film encapsulation layer 180 may form an angle substantially equal to the first angle $\theta_1$ of the first inclined portion 321*a*, which will be described below in detail with reference to FIGS. 5A, 5B and 5C.

The first reflection layer 331 may have a thickness of about 300 Å or more to improve reflectance. The first reflection layer 331 may include a metal material having high reflectance. For example, the first reflection layer 331 may include at least one of molybdenum (Mo), an alloy (MoTi) of molybdenum and titanium, aluminum (Al), silver (Ag), APC (Ag; Pb; Cu), and platinum (Pt).

The second low refractive index portion 322 overlaps the pixel defining layer 190 along the third direction. As illustrated in FIGS. 2A and 2B, the second low refractive index portion 322 may be disposed, on a plane, between the first low refractive index portion 321 and the high refractive index portion 311, and the second low refractive index portion 322 may have a shape surrounding the high refractive index portion 311. Accordingly, the second low refractive index portion 322 may have an area less than an area of the pixel defining layer 190 on a plane. However, exemplary embodiments are not limited thereto, and the second low refractive index portion 322 may be also on the first low refractive index portion 321 and the first reflection layer 331 to have an area substantially equal to an area of the pixel defining layer 190.

According to an exemplary embodiment, the second low refractive index portion 322 directly contacts the high refractive index portion 311. For example, the second low refractive index portion 322 directly contacts the high refractive index portion 311 at a second inclined portion 322*a*.

According to an exemplary embodiment, as shown in FIG. 4, light output from a first light extraction area LEA1 of the OLED 170 towards a lateral side may be totally reflected from the second inclined portion 322*a*, which is an interface between the high refractive index portion 311 and the second low refractive index portion 322, thereby being output toward a front side, and light from a second light extraction area LEA2 of the OLED 170 toward the lateral side is reflected from the first reflection layer 331, thereby being output toward the front side. Accordingly, the light output toward the lateral side from the first light extraction area LEA1 and the second light extraction area LEA2 of the OLED 170 is output toward a front side of the display device using the high refractive index portion 311, the first low refractive index portion 321, the first reflection layer 331, and the second low refractive index portion 322, such that light emission efficiency of the display device may be improved.

In such an exemplary embodiment, light emitted from an OLED 170 not adjacent to the second inclined portion 322*a* that is totally reflected from the second inclined portion 322*a* may have a color different from a color of a light that is emitted from an OLED 170 adjacent to the second inclined portion 322*a* that is totally reflected from the second inclined portion 322*a*. Accordingly, a color mixture phenomenon may occur, and display quality of the display device may be lowered. In order to substantially prevent this, light totally reflected from the second inclined portion 322*a* may be light emitted from the OLED 170 spaced apart from the first reflection layer 331 by a distance d1 of about 100 µm or less. In order to achieve optimum light emission efficiency, the second low refractive index portion 322 includes a second inclined portion 322*a* that forms a second angle $\theta_2$ with the upper surface of the thin film encapsulation layer 180. The second inclined portion 322*a* will be described below in detail with reference to FIGS. 5A, 5B and 5C.

The second low refractive index portion 322 may have a refractive index substantially equal to a refractive index of the first low refractive index portion 321, and the second low refractive index portion 322 may have a refractive index less than a refractive index of the high refractive index portion 311. For example, the high refractive index portion 311 may have a refractive index of about 1.65, and the first low refractive index portion 321 and the second low refractive index portion 322 may have a refractive index of about 1.5.

A second substrate 211 may be on the high refractive index portion 311 and the first low refractive index portion 321, the first reflection layer 331, and the second low refractive index portion 322. The material of the second substrate 211 is not particularly limited. For example, the second substrate 211 may include an insulating material, e.g., glass, plastic, quartz, or the like. The material for the second substrate 211 may be selected, for example, from materials which are excellent in mechanical strength, thermal stability, transparency, surface smoothness, ease of handling, water resistance, and the like. The second substrate 211 may be substantially the same as the first substrate 111.

According to an exemplary embodiment, a circular polarization plate 212 (see FIG. 4) may be on the capping layer 300, e.g., on the high refractive index portion 311, the first low refractive index portion 321, the first reflection layer 331, and the second low refractive index portion 322. The circular polarization plate 212 may include a linear polarization plate and a ¼λ phase difference plate. An external light incident from the outside to the display device is linearly polarized through the linear polarization plate of the circular polarization plate 212 and is circularly polarized through the ¼λ phase difference plate. The external light in the circularly polarized state is reflected by the first reflection layer 331, and passes through the ¼λ phase difference plate again to be in a linearly polarized state in a direction perpendicular to a transmission axis of the linear polarization plate. Accordingly, the incident external light may not be transmitted by the circular polarization plate 212 and may not exit to the outside, causing extinction interference. In other words, the circular polarization plate 212 may substantially prevent the external light from being emitted toward the front side of the display device after being reflected by at the interface between the high reflective index portion 311 and the first low refractive index portion 321, and at the first reflection layer 331 on the second low refractive index portion 322.

Figure 5A:
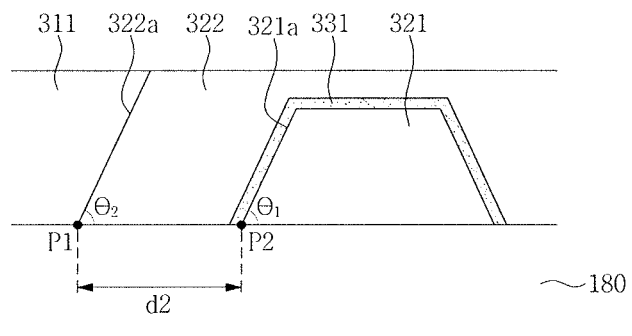
FIG. 5A illustrates an enlarged view of the high refractive index portion, the first low refractive index portion, the first reflection layer, and the second low refractive index portion according to an exemplary embodiment.

Hereinafter, the first inclined portion and the second inclined portion according to an exemplary embodiment will be described in detail with reference to FIGS. 5A, 5B and 5C. FIG. 5A is an enlarged view of the high refractive index portion, the first low refractive index portion, the first reflection layer, and the second low refractive index portion according to an exemplary embodiment, FIG. 5B is an enlarged view of a first inclined portion according to an exemplary embodiment, and FIG. 5C is an enlarged view of a second inclined portion according to an exemplary embodiment.

Referring to FIG. 5A, the first low refractive index portion 321 includes the first inclined portion 321a that forms the first angle $\theta_1$ with the upper surface of the thin film encapsulation layer 180, and the second low refractive index portion 322 includes the second inclined portion 322a that forms the second angle $\theta_2$ with the upper surface of the thin film encapsulation layer 180.

The first low refractive index portion 321 may be spaced apart from the high refractive index portion 311 by a distance d2 in a range from about 2 μm to about 10 μm. Specifically, a point P1 at which the thin film encapsulation layer 180, the high refractive index portion 311, and the second low refractive index portion 322 contact each other may be spaced apart from a second point P2 at which the first inclined portion 321a of the first low refractive index portion 321 contacts the thin film encapsulation layer 180 by a distance in a range from about 2 μm to about 10 μm. Accordingly, an area from which light may be extracted toward the front side of the display device increases, and the light emission efficiency of the display device according to an exemplary embodiment may be improved.

Figure 5B:
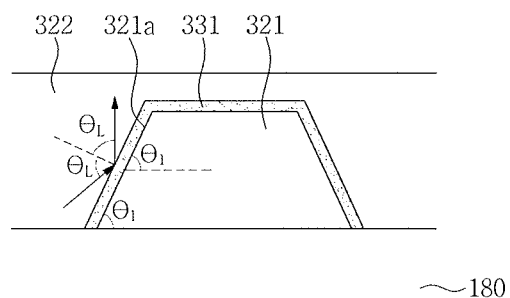
FIG. 5B illustrates an enlarged view of a first inclined portion according to an exemplary embodiment.
Figure 5C:
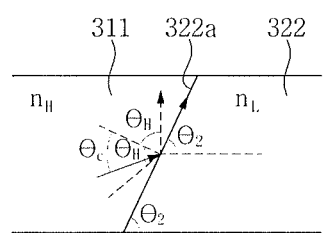
FIG. 5C illustrates an enlarged view of a second inclined portion according to an exemplary embodiment.

Referring to FIG. 5B, light incident on the first reflection layer 331 is reflected from the first reflection layer 331 at an angle $\theta_L$ substantially equal to an angle at which the light is incident on the first reflection layer 331 with respect to a line normal to the first reflection layer 331 according to law of reflection.

The first reflection layer 331 may cover the first low refractive index portion 321 and may have a uniform thickness. An upper surface of the first reflection layer 331 and the upper surface of the thin film encapsulation layer 180 may form an angle substantially equal to the first angle $\theta_1$ of the first inclined portion 321a.

Light emitted from the OLED 170 is incident to the first reflection layer 331 at an angle of about 0 degrees or more with respect to the upper surface of the thin film encapsulation layer 180. Accordingly, in order to output light incident on and reflected from the first reflection layer 331 toward the front side of the display device, the first angle $\theta_1$ may be about 45 degrees or more. According to an exemplary embodiment, the first angle $\theta_1$ may be about 48 degrees or more in order to substantially prevent a color mixture of the display device.

Referring to FIG. 5C, light incident on the interface between the high refractive index portion 311 and the second low refractive index portion 322 is totally reflected therefrom is reflected at an angle $\theta_H$ substantially equal to an angle at which the light is incident to the second low refractive index portion 322 with respect to the second inclined portion 322a of the second low refractive index portion 322 according to law of reflection.

When light incident on the second inclined portion 322a is emitted toward the front side of the display device, as the light emitted toward the front side of the display device is perpendicular to the thin film encapsulation layer 180 and a line normal to the second inclined portion 322a is perpendicular to a surface of the second inclined portion 322a, the second angle $\theta_2$ of the second inclined portion 322a may have a value substantially equal to a value of the incidence angle $\theta_H$ of the light incident to the second inclined portion 322.

The second inclined portion 322a is an interface between the high refractive index portion 311 and the second low refractive index portion 322. Thus, not all light incident to the second inclined portion 322a from the high refractive index portion 311 is totally reflected. As such, when a light is refracted from a medium having a relatively high refractive index to a medium having a relatively low refractive index, as an incidence angle increases, a refraction angle increases. In that case, an incidence angle when the refraction angle is about 90 degrees is called a critical angle $\theta_c$. In other words, only a light having an angle of about the critical angle $\theta_c$ or more among the light incident on the high refractive index portion 311 to the second inclined portion 322a is totally reflected from the second inclined portion 322a. Accordingly, the second angle $\theta_2$ of the second low refractive index portion 322 may be about 60 degrees or more.

For example, when a refractive index $n_H$ of the high refractive index portion 311 is about 1.65 and a refractive index $n_L$ of the first low refractive index portion 321 and the second low refractive index portion 322 is about 1.5, the critical angle $\theta_c$ may be calculated based on the following Mathematical Equation 1.

$$\theta_c = \arcsin(n_L/n_H) \qquad \text{[Mathematical Equation 1]}$$

The critical angle $\theta_c$ calculated by the Mathematical Equation 1 is about 65.38 degrees. When the refractive index $n_H$ of the high refractive index portion 311 is about 1.65 and a refractive index $n_L$ of the first low refractive index portion 321 and the second low refractive index portion 322 is about 1.5, the incidence angle $\theta_H$ of the light incident to the second inclined portion 322a and the second angle $\theta_2$ of the second inclined portion 322a may be about 65.38 degrees or more.

Figure 6:
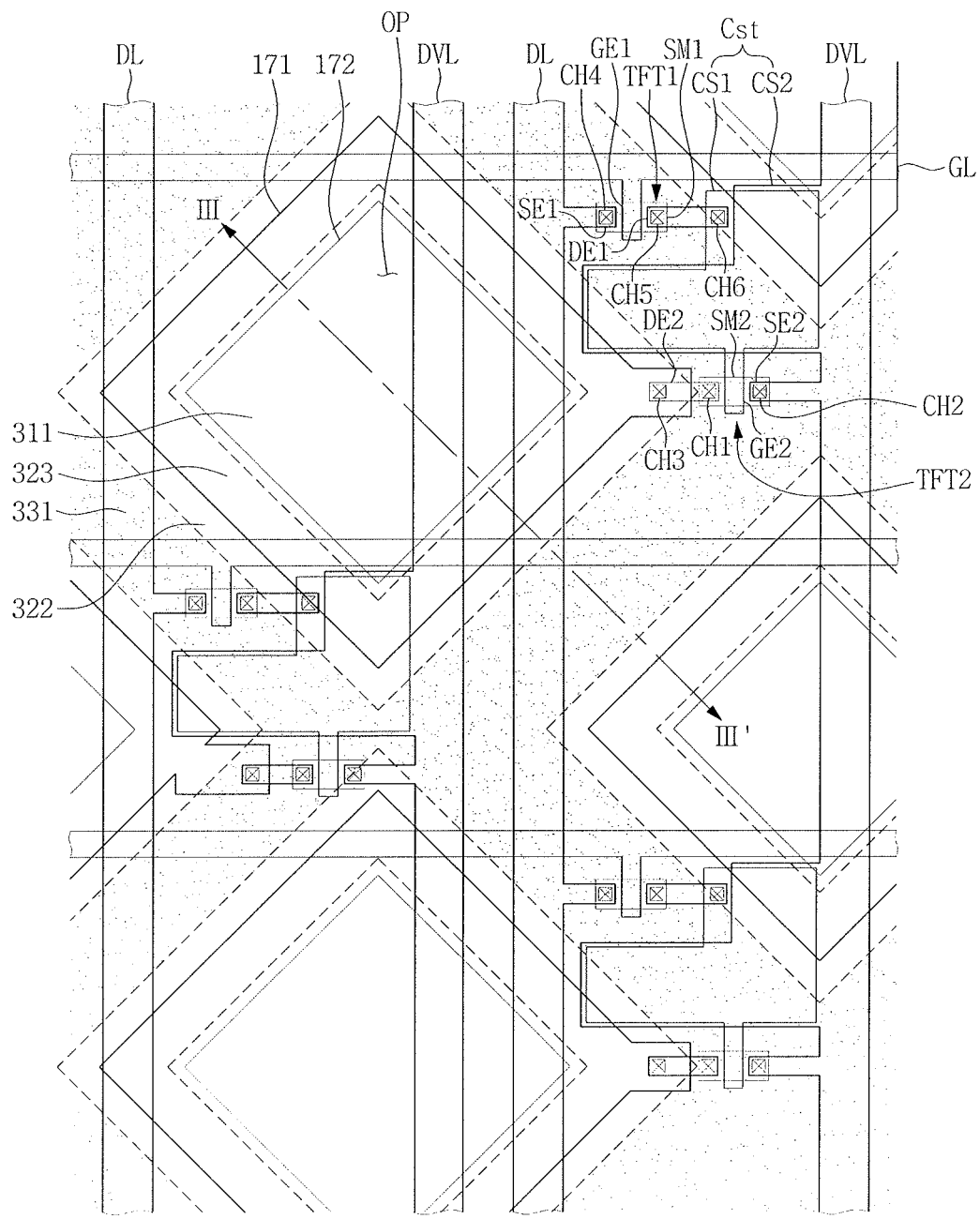
FIG. 6 illustrates a plan view of a pixel of a display device according to another exemplary embodiment.
Figure 7:
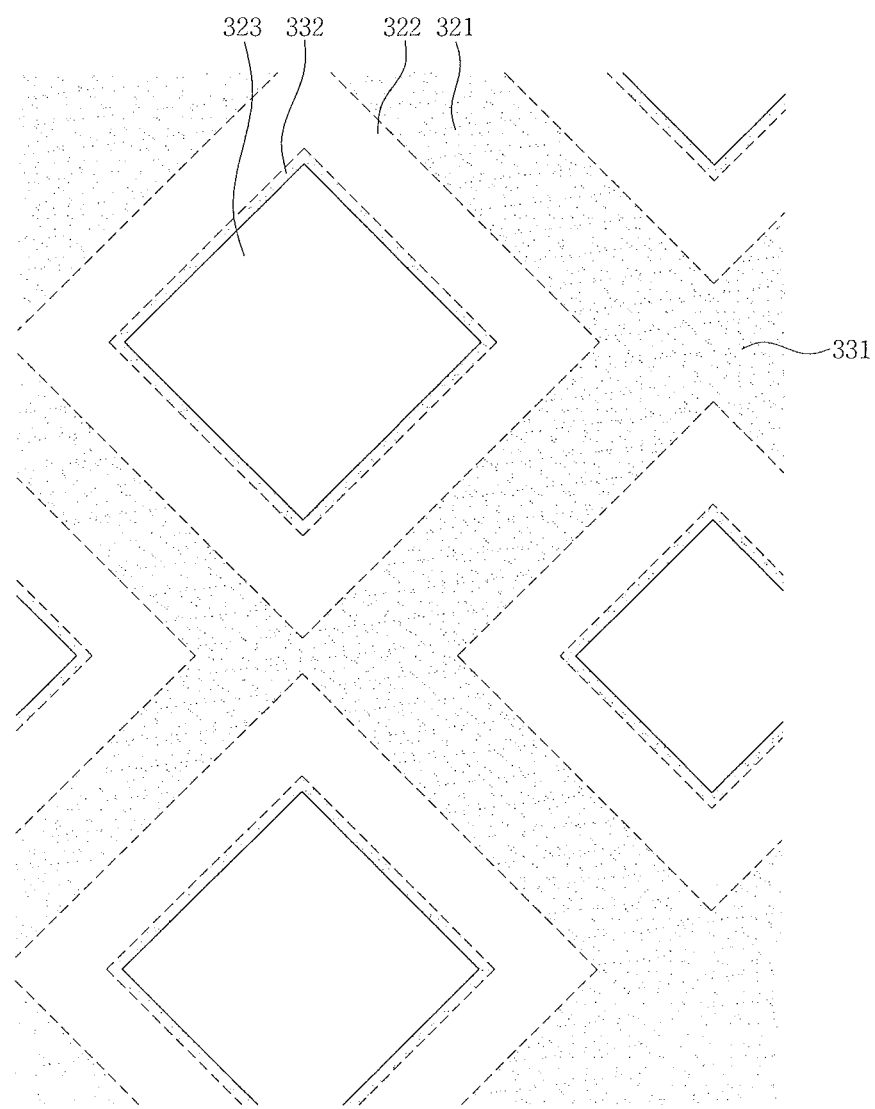
FIG. 7 illustrates a plan view of a first low refractive index portion, a first reflection layer, a second low refractive index portion, a second reflection layer, and a third low refractive index portion according to another exemplary embodiment.
Figure 8:
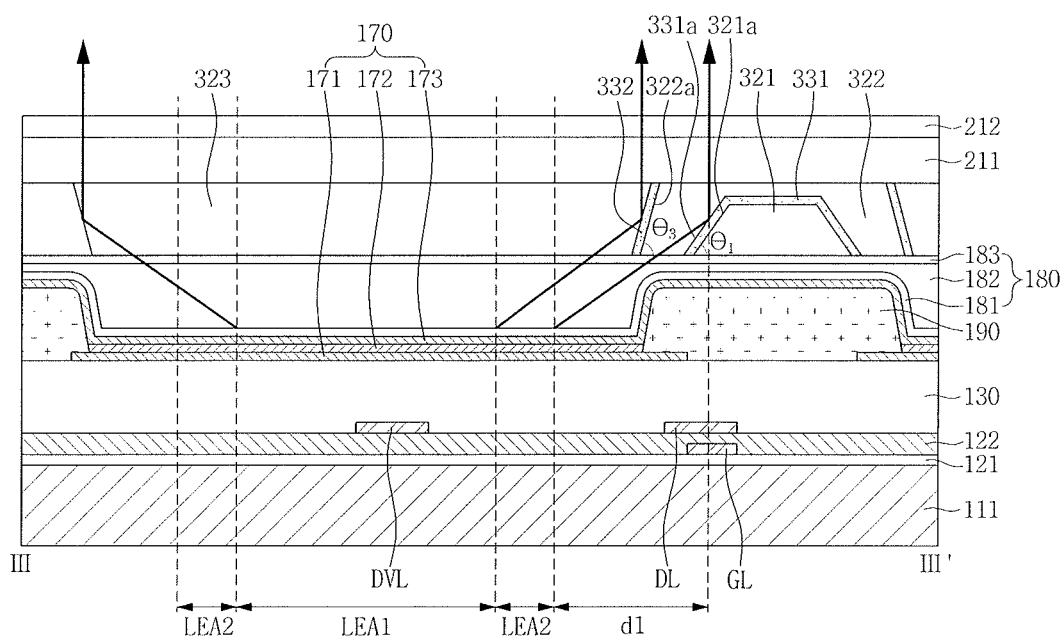
FIG. 8 illustrates a cross-sectional view taken along the line of FIG. 7.

FIG. 6 is a plan view illustrating a pixel of a display device according to another exemplary embodiment. FIG. 7 is a plan view illustrating a first low refractive index portion, a first reflection layer, a second low refractive index portion, a second reflection layer, and a third low refractive index portion according to another exemplary embodiment. FIG. 8 is a cross-sectional view taken along the line III-III' of FIG. 7.

Hereinafter, another exemplary embodiment will be described in detail with reference to FIGS. 6, 7, and 8. In order to avoid redundancy, descriptions of components described hereinabove will be omitted.

According to another exemplary embodiment, a capping layer 300a may include the first low refractive index portion 321, the first reflection layer 331, the second low refractive index portion 322, a second reflection layer 332, and a third low refractive index portion 323 on a thin film encapsulation layer 180. In particular, in this embodiment, the high refractive index layer is replaced by a low refractive index layer and a reflection layer, such that there are still two reflective boundaries adjacent the pixel area in the capping layer 300a.

The first low refractive index portion 321, the first reflection layer 331, the second low refractive index portion 322, and the second reflection layer 332 overlap the pixel defining layer 190, e.g., along the third direction, and the third low refractive index portion 323 overlaps at least a portion of a first electrode 171, e.g., overlaps a substantial entirety of the opening OP along the third direction.

The first low refractive index portion 321 overlaps the pixel defining layer 190, e.g., along the third direction, and may be spaced apart from the plurality of third low refractive index portions 323 between the plurality of third low refractive index portions 323 on a plane, e.g. along the first and second directions. Accordingly, the first low refractive index portion 321 may have an area less than an area of the pixel defining layer 190 on a plane.

The first low refractive index portion 321 may have a thickness less than a thickness of the third low refractive index portion 323. However, exemplary embodiments are not limited thereto, and the first low refractive index portion 321 may have a thickness substantially equal to a thickness of the third low refractive index portion 323.

The first low refractive index portion 321 may include the first inclined portion 321a which forms the first angle $θ_1$ with the upper surface of the thin film encapsulation layer 180. The first low refractive index portion 321 may have a refractive index substantially equal to a refractive index of the second low refractive index portion 322, and the first low refractive index portion 321 may have a refractive index substantially equal to a refractive index of the third low refractive index portion 323.

The first reflection layer 331 may be between the first low refractive index portion 321 and the second low refractive index portion 322, and may be spaced apart from the plurality of third low refractive index portions 323 between the plurality of third low refractive index portions 323 on a plane, e.g., along the first and second directions. Accordingly, the first reflection layer 331 may have an area less than an area of the pixel defining layer 190 on a plane.

The first reflection layer 331 may have a thickness of about 300 Å or more to improve reflectance. The first reflection layer 331 may cover the first low refractive index portion 321, e.g., side and upper surfaces thereof, and may have a uniform thickness. An upper surface of the first reflection layer 331 and the upper surface of the thin film encapsulation layer 180 may form an angle substantially equal to a first angle θ1 of the first inclined portion 321a.

The first reflection layer 331 may include a metal material having high reflectance. For example, the first reflection layer 331 may include at least one of molybdenum (Mo), an alloy (MoTi) of molybdenum and titanium, aluminum (Al), silver (Ag), APC (Ag; Pb; Cu), and platinum (Pt).

The second low refractive index portion 322 overlaps the pixel defining layer 190 on a plane, and is between the first low refractive index portion 321 and the third low refractive index portion 323 on a plane. Accordingly, the second low refractive index portion 322 may have an area less than an area of the pixel defining layer 190 on a plane. However, exemplary embodiments are not limited thereto, and the second low refractive index portion 322 may be on the first low refractive index portion 321 and the first reflection layer 331, and the second low refractive index portion 322 may have an area substantially equal to an area of the pixel defining layer 190.

The second low refractive index portion 322 includes a second inclined portion 322a which forms a third angle $θ_3$ with the upper surface of the thin film encapsulation layer 180.

The second reflection layer 332 is between the second low refractive index portion 322 and the third low refractive index portion 323, and spaced apart from the plurality of third low refractive index portions 323 between the plurality of third low refractive index portions 323 on a plane. Accordingly, the second reflection layer 332 may have an area less than an area of the pixel defining layer 190 on a plane.

The second reflection layer 332 may have a thickness of about 300 Å or more to improve reflectance. The second reflection layer 332 may cover the second inclined portion 322a of the second low refractive index portion 322 and have a uniform thickness. An upper surface of the second reflection layer 332 and the upper surface of the thin film encapsulation layer 180 may form an angle substantially equal to the third angle $θ_3$ of the second inclined portion 322a.

The second reflection layer 332 may include a metal material having high reflectance. For example, the second reflection layer 332 may include at least one of molybdenum (Mo), an alloy (MoTi) of molybdenum and titanium, aluminum (Al), silver (Ag), APC (Ag; Pb; Cu), and platinum (Pt). The second reflection layer 332 may include a material substantially equal to a material included in the first reflection layer 331.

The first reflection layer 331 and the second reflection layer 332 may reflect a light emitted toward a lateral side of the display device toward a front side of the display device. To this end, the first angle $θ_1$ of the first inclined portion 321a may be about 45 degrees or more and the third angle $θ_3$ of the second inclined portion 322a may be about 45 degrees or more. Accordingly, the upper surface of the first reflection layer 331 and the upper surface of the thin film encapsulation layer 180 may form an angle of about 45 degrees or more which is substantially equal to the first angle $θ_1$, and the upper surface of the second reflection layer 332 and the upper surface of the thin film encapsulation layer 180 may form an angle of about 45 degrees or more which is substantially equal to the third angle $θ_3$. According to another exemplary embodiment, in order to substantially prevent a color mixture of the display device, each of the first angle θ1 and the third angle $θ_3$ may be about 48 degrees or more, and the upper surface of the thin film encapsulation layer 180 and respective upper surfaces of the first reflection layer 331 and the second reflection layer 332 may form an angle of about 48 degrees or more.

Figure 9:
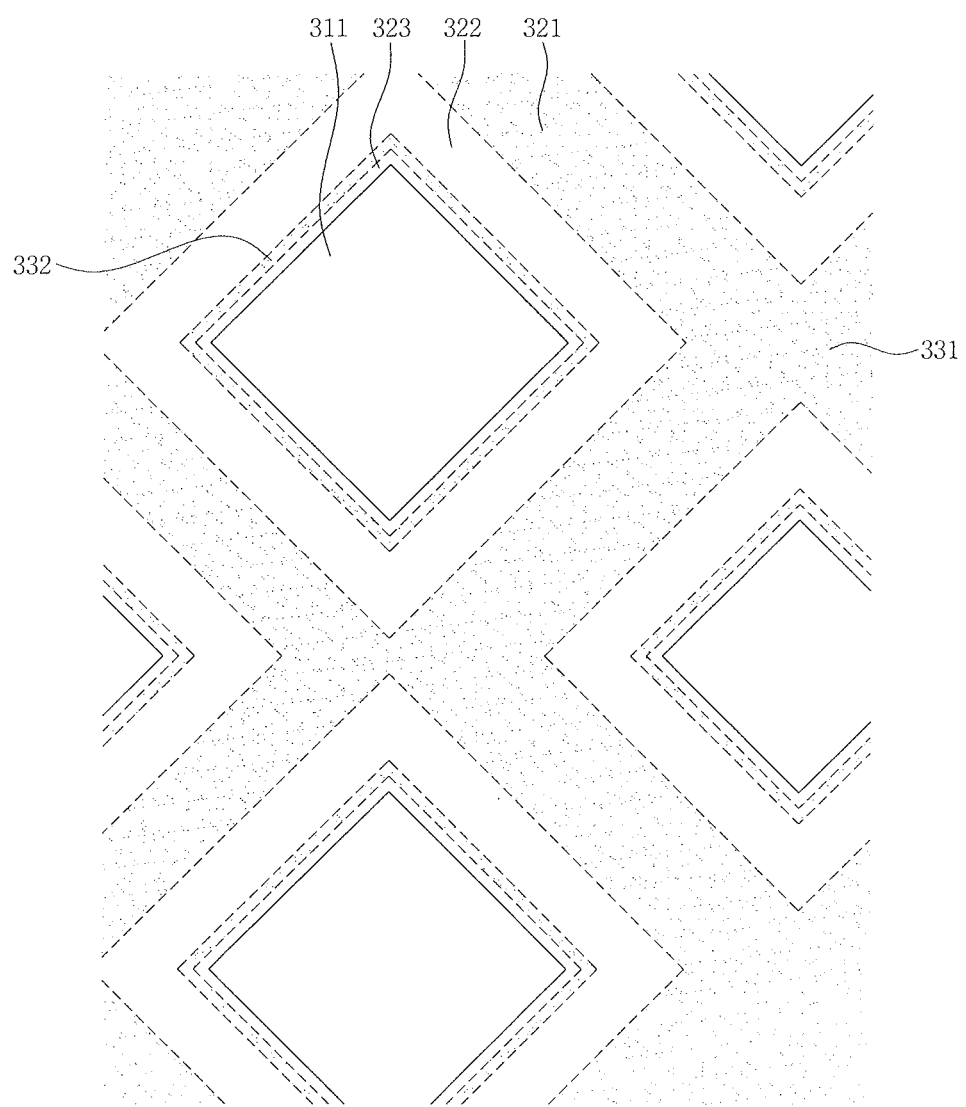
FIG. 9 illustrates a plan view of a high refractive index portion, a first low refractive index portion, a first reflection layer, a second low refractive index portion, a second reflection layer, and a third low refractive index portion according to still another exemplary embodiment.
Figure 10:
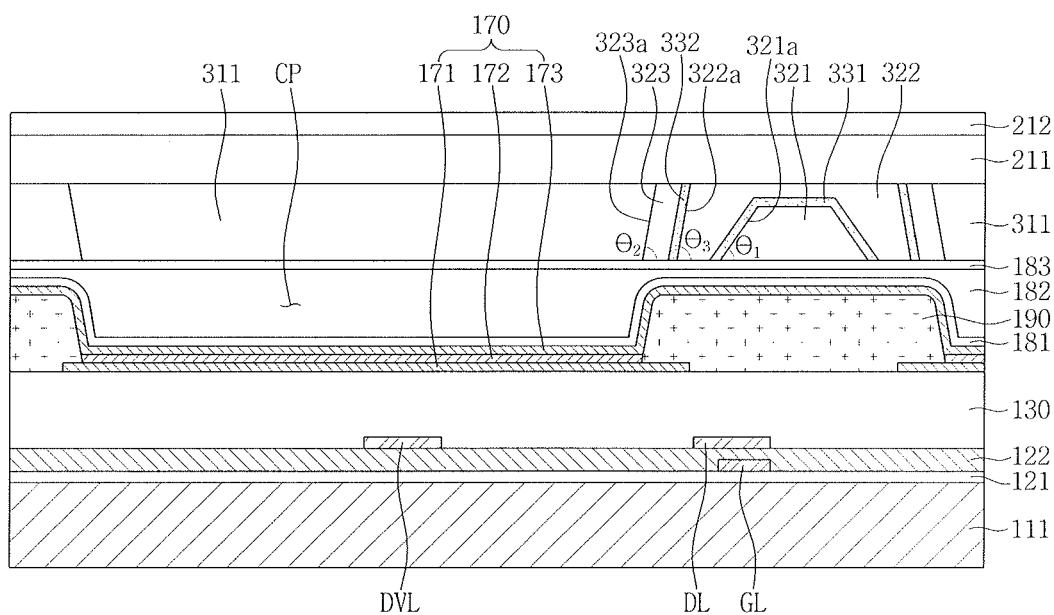
FIG. 10 illustrates a cross-sectional view of a display device according to still another exemplary embodiment.

FIG. 9 is a plan view illustrating a high refractive index portion, the first low refractive index portion, the first reflection layer, the second low refractive index portion, the second reflection layer, and the third low refractive index portion according to still another exemplary embodiment, and FIG. 10 is a cross-sectional view illustrating a display device according to still another exemplary embodiment. Hereinafter, still another exemplary embodiment will be described in detail with reference to FIGS. 9 and 10. In order to avoid redundancy, descriptions of components described hereinabove will be omitted.

According to still another exemplary embodiment, a capping layer 300b may include the high refractive index portion 311, the first low refractive index portion 321, the first reflection layer 331, the second low refractive index portion 322, the second reflection layer 332, and the third low refractive index portion 323 on the thin film encapsulation layer 180.

The high refractive index portion 311 overlaps at least a portion of a first electrode 171 on a plane, e.g., along the third direction. Specifically, the high refractive index portion 311 overlaps an opening OP of the pixel defining layer 190. The high refractive index portion 311 may have an area less than an area of the first electrode 171 on a plane and have an area substantially equal to an area of the opening OP on a plane. However, exemplary embodiments are not limited thereto, and the high refractive index portion 311 may have an area larger than an area of the opening OP on a plane.

Upper surfaces of the high refractive index portion 311, the first low refractive index portion 321, the first reflection layer 331, the second low refractive index portion 322, the second reflection layer 332, and the third low refractive index portion 323 may be flat. However, exemplary embodiments are not limited thereto.

The high refractive index portion 311 has a refractive index higher than refractive indices of the first low refractive index portion 321, the second low refractive index portion 322, and the third low refractive index portion 323 to be described below. Specifically, the high refractive index portion 311 may have a refractive index of about 1.6 or more, and the first low refractive index portion 321, the second low refractive index portion 322, and the third low refractive index portion 323 may have a refractive index less than about 1.6. For example, the high refractive index portion 311 may have a refractive index of about 1.65, and the first low refractive index portion 321, the second low refractive index portion 322, and the third low refractive index portion 323 may have a refractive index of about 1.5.

The first low refractive index portion 321, the first reflection layer 331, the second low refractive index portion 322, the second reflection layer 332, and the third low refractive index portion 323 overlap the pixel defining layer 190 along the third direction.

The first low refractive index portion 321 overlaps the pixel defining layer 190 and is spaced apart from the plurality of high refractive index portions 311 between the plurality of high refractive index portions 311 on a plane. Accordingly, the first low refractive index portion 321 may have an area less than an area of the pixel defining layer 190 on a plane.

The first low refractive index portion 321 may have a thickness less than a thickness of the high refractive index portion 311. However, exemplary embodiments are not limited thereto, and the first low refractive index portion 321 may have a thickness substantially equal to a thickness of the high refractive index portion 311.

The first low refractive index portion 321 may have a refractive index lower than a refractive index of the high refractive index portion 311. Specifically, the high refractive index portion 311 may have a refractive index of about 1.6 or more, and the first low refractive index portion 321 and the second low refractive index portion 322 may have a refractive index less than about 1.6. For example, the high refractive index portion 311 may have a refractive index of about 1.65, and the first low refractive index portion 321, the second low refractive index portion 322, and the third low refractive index portion 323 may have a refractive index of about 1.5.

The first low refractive index portion 321 includes a first inclined portion 321a that forms the first angle θ1 with an upper surface of the thin film encapsulation layer 180.

The first reflection layer 331 may be between the first low refractive index portion 321 and the second low refractive index portion 322, and is spaced apart from the plurality of high refractive index portions 311 between the plurality of high refractive index portions 311 on a plane. Accordingly, the first reflection layer 331 may have an area less than an area of the pixel defining layer 190 on a plane.

The first reflection layer 331 may have a thickness of about 300 Å or more to improve reflectance. The first reflection layer 331 may cover the first low refractive index portion 321, e.g., side and upper surfaces thereof, and may have a uniform thickness.

An upper surface of the first reflection layer 331 and the upper surface of the thin film encapsulation layer 180 may form an angle substantially equal to the first angle θ1 of the first inclined portion 321a.

The first reflection layer 331 may include a metal material having high reflectance. For example, the first reflection layer 331 may include at least one of molybdenum (Mo), an alloy (MoTi) of molybdenum and titanium, aluminum (Al), silver (Ag), APC (Ag; Pb; Cu), and platinum (Pt).

The second low refractive index portion 322 overlaps the pixel defining layer 190 on a plane. Specifically, the second low refractive index portion 322 may be between the first low refractive index portion 321 and the third low refractive index portion 323 on a plane. Accordingly, the second low refractive index portion 322 may have an area less than an area of the pixel defining layer 190 on a plane. However, exemplary embodiments are not limited thereto, and the second low refractive index portion 322 may be disposed on the first low refractive index portion 321 and the first reflection layer 331.

The second reflection layer 332 is between the second low refractive index portion 322 and the third low refractive index portion 323, and is spaced apart from the plurality of high refractive index portions 311 between the plurality of high refractive index portions 311 on a plane. Accordingly, the second reflection layer 332 may have an area less than an area of the pixel defining layer 190 on a plane.

The second reflection layer 332 may have a thickness of 300 Å or more to improve reflectance. The second reflection layer 332 may cover the second inclined portion 322a of the second low refractive index portion 322 and may have a uniform thickness. An upper surface of the second reflection layer 332 and the upper surface of the thin film encapsulation layer 180 may form an angle substantially equal to the third angle θ3 of the second inclined portion 322a.

The second reflection layer 332 may include a metal material having high reflectance. For example, the second reflection layer 332 may include at least one of molybdenum (Mo), an alloy (MoTi) of molybdenum and titanium, aluminum (Al), silver (Ag), APC (Ag; Pb; Cu), and platinum (Pt). The second reflection layer 332 may include a material substantially equal to a material included in the first reflection layer 331.

The first reflection layer 331 and the second reflection layer 332 may reflect a light emitted toward a lateral side of the display device toward a front side of the display device. To this end, the first angle θ1 of the first inclined portion 321a may be about 45 degrees or more and the third angle θ3 of the second inclined portion 322a may be about 45 degrees or more. Accordingly, the upper surface of the first reflection layer 331 and the upper surface of the thin film encapsulation layer 180 may form an angle of about 45 degrees or more which is substantially equal to the first angle θ1, and the upper surface of the second reflection layer 332 and the upper surface of the thin film encapsulation layer 180 may form an angle of about 45 degrees or more which is substantially equal to the third angle θ3. According to the present exemplary embodiment, in order to substantially prevent a color mixture of the display device, each of the first angle θ1 and the third angle θ3 may be about 48 degrees or more, and the upper surface of the thin film encapsulation layer 180 and respective upper surfaces of the first reflection layer 331 and the second reflection layer 332 may form an angle of about 48 degrees or more.

The third low refractive index portion 323 overlaps the pixel defining layer 190 on a plane. Specifically, the third low refractive index portion 323 may be disposed on a plane between the second low refractive index portion 322 and the high refractive index portion 311. Accordingly, the third low refractive index portion 323 may have an area less than an area of the pixel defining layer 190. However, exemplary embodiments are not limited thereto, and the third low refractive index portion 323 may be on the second lower refractive index portion 322 and the second reflection layer 332, and the third low refractive index portion 323 may have an area substantially equal to an area of the pixel defining layer 190 on a plane.

The third low refractive index portion 323 may directly contact the high refractive index portion 311. Specifically, the third low refractive index portion 323 directly contacts the high refractive index portion 311 at a third inclined portion 323a.

According to the present exemplary embodiment, a light output toward a lateral side of the OLED 170 is totally reflected from the third inclined portion 323a, which is an interface between the high refractive index portion 311 and the third low refractive index portion 323, thereby being output toward a front side. Accordingly, the light output toward the lateral side of the OLED 170 is output toward a front side of the display device such that light emission efficiency of the display device may be improved.

However, light that is emitted from an OLED 170 not adjacent to the third inclined portion 323a and totally reflected from the third inclined portion 323a may have a color different from a color of a light that is emitted from an OLED 170 adjacent to the third inclined portion 323a and totally reflected from the third inclined portion 323a. Accordingly, a color mixture phenomenon may occur, and display quality of the display device may be lowered. In order to substantially prevent this, the third low refractive index portion 323 includes the third inclined portion 323a that forms the second angle $\theta_2$ with the upper surface of the thin film encapsulation layer 180.

The third inclined portion 323a is an interface between the high refractive index portion 311 and the third low refractive index portion 323. Not that all light incident on the third inclined portion 323a is totally reflected. As such, when light is refracted from a medium having a relatively high refractive index to a medium having a relatively low refractive index, as an incidence angle increases, a refraction angle increases. In that case, an incidence angle when the refraction angle is about 90 degrees is called a critical angle $\theta_c$. In other words, only a light having an angle of about the critical angle $\theta_c$ or more among the light incident from the high refractive index portion 311 to the third inclined portion 323a is totally reflected from the third inclined portion 323a. Accordingly, the second angle $\theta_2$ of the third inclined portion 323a may have an angle of about 60 degrees or more. For example, when a refractive index of the high refractive index portion 311 is about 1.65 and refractive indices of the first low refractive index portion 321, the second low refractive index portion 322, and the third low refractive index portion is about 1.5, the critical angle $\theta_c$ is about 65.38 degrees, and an incidence angle of the light incident to the third inclined portion 323a and the second angle $\theta_2$ of the third inclined portion 323a may be an angle of about 65.38 degrees or more.

As set forth hereinabove, according to one or more exemplary embodiments, the display device includes a capping layer having two reflective interfaces adjacent the light emission or pixel area on a thin film encapsulation layer, and spaced apart from one another in a plane view. Light emitted from an OLED towards the side of the device may be directed to the front side of the display device due to the two reflective interfaces, thereby increasing light emission efficiency. The reflective interfaces may include a boundary between high and low refractive index materials and/or a reflective layer.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A display device, comprising:
 a first substrate;
 an organic light emitting element on the first substrate and including a first electrode, an organic light emitting layer, and a second electrode;
 a pixel defining layer surrounding the first electrode on the first substrate;
 a thin film encapsulation layer on the second electrode and the pixel defining layer;
 a high refractive index portion overlapping, on a plane, at least a portion of the first electrode on the thin film encapsulation layer;
 a first low refractive index portion on the thin film encapsulation layer, the first low refractive index portion overlapping, on a plane, the pixel defining layer, and including a first inclined portion forming a first angle with the thin film encapsulation layer;
 a second low refractive index portion on the thin film encapsulation layer, the second low refractive index portion being, on a plane, between the first low refractive index portion and the high refractive index portion, and including a second inclined portion forming a second angle with the thin film encapsulation layer; and
 a first reflection layer on the thin film encapsulation layer, the first reflection layer being, on a plane, between the first low refractive index portion and the second low refractive index portion on the thin film encapsulation layer,
 wherein two or more of the high refractive index portion, the first low refractive index portion, and the second low refractive index portion at least partially contact a same layer that is disposed between the first electrode and the first reflection layer in a direction perpendicular to an upper surface of the first substrate.

2. The display device as claimed in claim 1, wherein the first angle is about 45 degrees or more.

3. The display device as claimed in claim 1, wherein the second angle is about 60 degrees or more.

4. The display device as claimed in claim 1, wherein the high refractive index portion has a refractive index of about 1.6 or more and the first and second low refractive index portions have refractive indices less than about 1.6.

5. The display device as claimed in claim 1, wherein the first low refractive index portion has a refractive index substantially equal to a refractive index of the second low refractive index portion.

6. The display device as claimed in claim 1, further comprising a circular polarization plate on the high refractive index portion, the first low refractive index portion, and the second low refractive index portion.

7. The display device as claimed in claim 1, wherein the first reflection layer includes at least one of molybdenum (Mo), an alloy (MoTi) of molybdenum and titanium, aluminum (Al), silver (Ag), APC (Ag; Pb; Cu), and platinum (Pt).

8. The display device as claimed in claim 1, wherein the first reflection layer has a thickness of about 300 Å or more.

9. The display device as claimed in claim 1, wherein the first low refractive index portion has a thickness less than a thickness of the second low refractive index portion.

10. The display device as claimed in claim 9, wherein the second low refractive index portion is on the first low refractive index portion and the first reflection layer.

11. The display device of claim 1, wherein two or more of the high refractive index portion, the first low refractive index portion, the second low refractive index portion, and the first reflection layer at least partially contact the thin film encapsulation layer.

12. A display device, comprising:
a first substrate;
an organic light emitting element on the first substrate and including a first electrode, an organic light emitting layer, and a second electrode;
a pixel defining layer surrounding the first electrode on the first substrate;
a thin film encapsulation layer on the second electrode and the pixel defining layer;
a high refractive index portion on the thin film encapsulation layer, the high refractive index portion overlapping at least a portion of the first electrode;
a first low refractive index portion on the thin film encapsulation layer, the first low refractive index portion overlapping, on a plane, the pixel defining layer and including a first inclined portion forming a first angle with the thin film encapsulation layer;
a second low refractive index portion including a second inclined portion forming a second angle with the thin film encapsulation layer;
a third low refractive index portion directly contacting the high refractive index portion, spaced apart from the first low refractive index portion, and including a third inclined portion forming a third angle with the thin film encapsulation layer;
a first reflection layer between the first low refractive index portion and the second low refractive index portion; and
a second reflection layer between the second low refractive index portion and the third low refractive index portion,
wherein the second low refractive index portion is between the first low refractive index portion and the third low refractive index portion on a plane,
wherein two or more of the high refractive index portion, the first low refractive index portion, and the second low refractive index portion at least partially contact a same layer that is disposed between the first electrode and the first reflection layer in a direction perpendicular to an upper surface of the first substrate.

13. The display device as claimed in claim 12, wherein:
the first low refractive index portion has a refractive index substantially equal to a refractive index of the second low refractive index portion, and
the second low refractive index portion has a refractive index substantially equal to a refractive index of the third low refractive index portion.

14. The display device as claimed in claim 12, wherein the first angle and the second angle are about 45 degrees or more.

15. The display device as claimed in claim 12, wherein the third angle is about 60 degrees or more.

16. The display device as claimed in claim 12, wherein the high refractive index portion has a refractive index of about 1.6 or more, and the first, second and third low refractive index portions have refractive indices less than about 1.6.

17. The display device as claimed in claim 12, wherein the first low refractive index portion has a refractive index substantially equal to a refractive index of the second low refractive index portion, and the first low refractive index portion has a refractive index substantially equal to a refractive index of the third low refractive index portion.

* * * * *